(12) United States Patent
Altmann et al.

(10) Patent No.: US 11,436,393 B2
(45) Date of Patent: Sep. 6, 2022

(54) METHOD AND DEVICE FOR MONITORING A POWER SUPPLY DEVICE OF A TRAFFIC SYSTEM

(71) Applicant: SIEMENS MOBILITY GMBH, Munich (DE)

(72) Inventors: Martin Altmann, Erlangen (DE); Otto Schmid, Roettenbach (DE); Imre Pomeisl, Moehrendorf (DE)

(73) Assignee: Siemens Mobility GmbH, Munich (DE)

( * ) Notice: Subject to any disclaimer, the term of this patent is extended or adjusted under 35 U.S.C. 154(b) by 639 days.

(21) Appl. No.: 16/316,059

(22) PCT Filed: Jul. 4, 2017

(86) PCT No.: PCT/EP2017/066554
§ 371 (c)(1),
(2) Date: Jan. 8, 2019

(87) PCT Pub. No.: WO2018/007345
PCT Pub. Date: Jan. 11, 2018

(65) Prior Publication Data
US 2019/0311078 A1 Oct. 10, 2019

(30) Foreign Application Priority Data
Jul. 8, 2016 (DE) .............. 10 2016 212 494.3

(51) Int. Cl.
*G06F 30/20* (2020.01)
*B60M 7/00* (2006.01)
(Continued)

(52) U.S. Cl.
CPC ............... *G06F 30/20* (2020.01); *H02J 3/14* (2013.01); *H02J 4/00* (2013.01); *H02J 13/00* (2013.01);
(Continued)

(58) Field of Classification Search
CPC ........ B60M 7/00; B60M 3/00; H02J 2310/12; H02J 13/00; H02J 3/14; H02J 4/00; Y02B 70/3225; Y04S 20/222; G06F 30/20
(Continued)

(56) References Cited

U.S. PATENT DOCUMENTS

| 5,346,163 A | 9/1994 | Momma et al. |
| 2011/0144831 A1 | 6/2011 | Hata |

FOREIGN PATENT DOCUMENTS

| EP | 0464423 B1 | 10/1994 |
| EP | 1717923 A1 | 11/2006 |

(Continued)

OTHER PUBLICATIONS

Lars Abrahamsson, Railway power supply models and methods for long-term investment analysis, 2008, Licentiate Thesis, KTH, Royal Institute of Technology, Stockholm, Sweden, 154 pages.*

(Continued)

*Primary Examiner* — Juan C Ochoa
(74) *Attorney, Agent, or Firm* — Laurence A. Greenberg; Werner H. Stemer; Ralph E. Locher

(57) ABSTRACT

A method and a device for monitoring a power supply apparatus of a traffic system. A computer-based model of the power supply apparatus is created inter alia with the aid of predetermined parameters which are relevant for the power supply apparatus. The invention aims to meet changed requirements of modern power supply devices. Current characteristic quantities are determined during the operation of the traffic system and the operation of the power supply device is simulated at least with the aid of the model and the characteristic quantities.

8 Claims, 2 Drawing Sheets

(51) Int. Cl.
*H02J 4/00* (2006.01)
*H02J 13/00* (2006.01)
*H02J 3/14* (2006.01)

(52) U.S. Cl.
CPC ............ *B60M 7/00* (2013.01); *Y02B 70/3225* (2013.01); *Y04S 20/222* (2013.01)

(58) Field of Classification Search
USPC .......................................................... 703/18
See application file for complete search history.

(56) References Cited

FOREIGN PATENT DOCUMENTS

| | | | |
|---|---|---|---|
| EP | 2320289 A2 | 5/2011 | |
| EP | 2400616 A2 | 12/2011 | |
| EP | 2620343 A2 | 7/2013 | |
| EP | 2882060 A1 | 6/2015 | |
| JP | 3350084 B2 | 11/2002 | |
| KR | 20130129593 | * 11/2013 | .............. B61L 27/00 |
| KR | 20130129593 A | 11/2013 | |

OTHER PUBLICATIONS

Lars Abrahamsson, Optimal Railroad Power Supply System Operation and Design, 2012, Doctoral dissertation, KTH, Royal Institute of Technology, Stockholm, Sweden, 76 pages.*

* cited by examiner

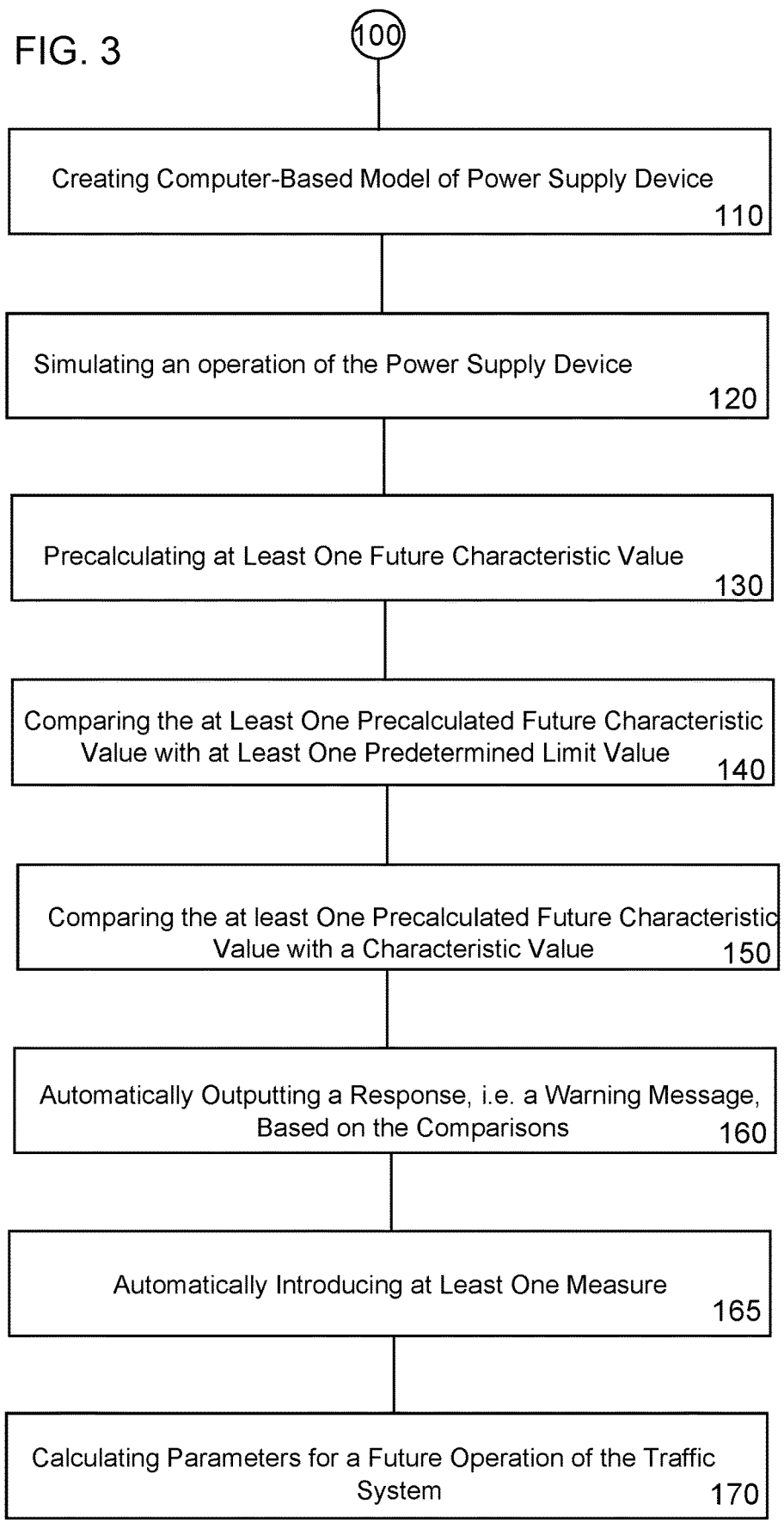

METHOD AND DEVICE FOR MONITORING A POWER SUPPLY DEVICE OF A TRAFFIC SYSTEM

BACKGROUND OF THE INVENTION

Field of the Invention

The invention relates to a method for monitoring a power supply device of a traffic system, in which a computer-based model of the power supply device is created inter alia with the aid of predetermined parameters which are relevant to the power supply device.

Furthermore, the invention relates to a device for monitoring a power supply device of a traffic system with at least one model device, which creates a computer-based model of the power supply device from predetermined parameters which are relevant to the power supply device.

The method and device of the afore-described type is known from the prior art, for instance by the simulation software Sitras Sidytrac by the company Siemens, with the aid of which an AC or DC traction power supply can be simulated. In this regard, predetermined parameters, which are relevant to the power supply device, are entered and the software then creates a computer-based model of the power supply device. Information which is relevant to the design of the power supply device, for instance, can be taken from the model. The known method and the software enable a power supply device to be better planned in the design phase, in order to guarantee an adequate and optimal design.

The planning software known from the prior art models the drive operation with the power supply such that it is designed for the application points specified at this point in time. The simulation can last a number of hours and frequently forms the basis of the design of the power supply device.

A power supply device can inter alia contain, for instance, a feed from a higher-order network, AC switching systems for high voltage, medium voltage and low voltage, DC switching systems, transformers, rectifiers, inverters, converters, protection devices and station control technology, renewable energies, storage units, cable, contact line components and other line components for conducting the current.

However, current power supply devices can be harder to predict than before, since, for instance, not all parameters are known for the design, the power supply is sometimes not sufficiently large, timetables change frequently or their punctuality is not always possible. Furthermore, the current application of decentralized power sources, such as wind power or solar systems, energy storage systems or a load management, for instance, makes the rail networks more dynamic and more difficult to predict in the course of an energy management.

SUMMARY OF THE INVENTION

It is therefore the object of the present invention to provide a method and device of the type cited in the introduction which meet the changed requirements on a power supply device of a traffic system.

The object is achieved in accordance with the invention for the method cited in the introduction such that at least one current characteristic quantity is determined during the ongoing operation of the traffic system and the operation of the power supply device is simulated at least with the aid of the model and the characteristic quantity.

The device cited in the introduction achieves the cited object in accordance with the invention in that it has at least one detection device, which is embodied to determine at least one current characteristic quantity of the traffic system during ongoing operation, and at least one simulation device, which is embodied to simulate the power supply device with the aid of the model and the at least one characteristic quantity.

The inventive solution has the advantage that the power supply device is simulated during its operation and not only in the planning phase. As a result, the simulation is kept up to date and the current state of the power supply device can be easily taken therefrom. The inventive simulation of the power supply device allows operating parameters of the power supply device which run as required during real operation to be calculated and monitored.

Furthermore, a future behavior of the power supply device can be determined by the inventive simulation. Corresponding measures which can also be introduced automatically can be derived therefrom.

The inventive solution allows the energy requirement and energy consumption, load flows and load limits of systems and components of the power supply device of the traffic system, operating limits, usefulness of the application of storage solutions and feedback systems, as well as their application parameters, to be calculated, for instance. The results can be used in the course of SCADA and energy management systems, for instance, including load management, in order to improve these. The values currently calculated with the aid of the invention allow for higher reaction speeds for influencing and optimizing operation. With SCADA systems, what are known as 'what if queries' are supported ahead of corresponding switching operations and automatic operational recommendations, calculations and alarms in the case of unfavorable operating points, particularly with weak track sections or with special timetables.

For energy management systems, the invention produces new possibilities with respect to load flow predictions and an optimized operation of the power supply. Furthermore, automatic reports can be issued to the driver by driver advisory systems. Furthermore, an automatic influence can be implemented when limits in terms of power supply or optimization of the operational regime are achieved in accordance with an ideal energy system, for instance in order to avoid load peaks. Instead of a person-based know-how which may be problematic with a high staff turnover or a generation change, for instance, the invention enables a system-based know-how to be established for the purpose of protection and settings.

The inventive solution can be further developed by advantageous embodiments which are described below.

At least one future characteristic value can therefore be precalculated with the aid of the simulation at least in one desired future time frame and the characteristic value can be compared with at least one predetermined limit value. This is advantageous in that an imminent exceeding of limit values can be promptly identified and corresponding countermeasures can be taken.

In order to still better indicate or actively respond to an imminent exceeding of the limit values, at least one warning message can be output automatically or at least one measure can be introduced automatically when the limit values are reached and/or exceeded. The warning message can be transmitted to a control room of the traffic system or the power supply device, for instance.

Furthermore, at least one simulated characteristic value can be calculated with the aid of the simulation and the simulated characteristic value can be compared with a characteristic value determined during ongoing operation of the traffic system.

Simulated and future characteristic values are for instance electric characteristic values such as current, voltage and variables which can be derived therefrom such as impedances, resistances, output or energy.

In an advantageous embodiment, the current characteristic quantities and/or the characteristic values can be determined in real time. This is advantageous in that the inventive method operates particularly quickly and as a result measures can be taken quickly and at short notice. The method is therefore particularly suited to the current dynamic energy networks.

According to a particularly preferred development of the invention, specifications for the future operation of the traffic system can be calculated with the aid of the simulation. This is advantageous in that an improved operational planning of the traffic system is possible.

The invention finally also relates to a railway system, which comprises an inventive device according to the aforecited embodiment.

A traffic system may be for instance a railway system with track-bound vehicles or also a system with e-trucks, in other words trucks with an electric power supply.

BRIEF DESCRIPTION OF THE SEVERAL VIEWS OF THE DRAWING

The invention will be described below making reference to the accompanying drawings.

There is shown:

FIG. 3 is a flowchart illustrating the basic steps of the method for monitoring a power supply device of a traffic system.

DESCRIPTION OF THE INVENTION

Figure 1:
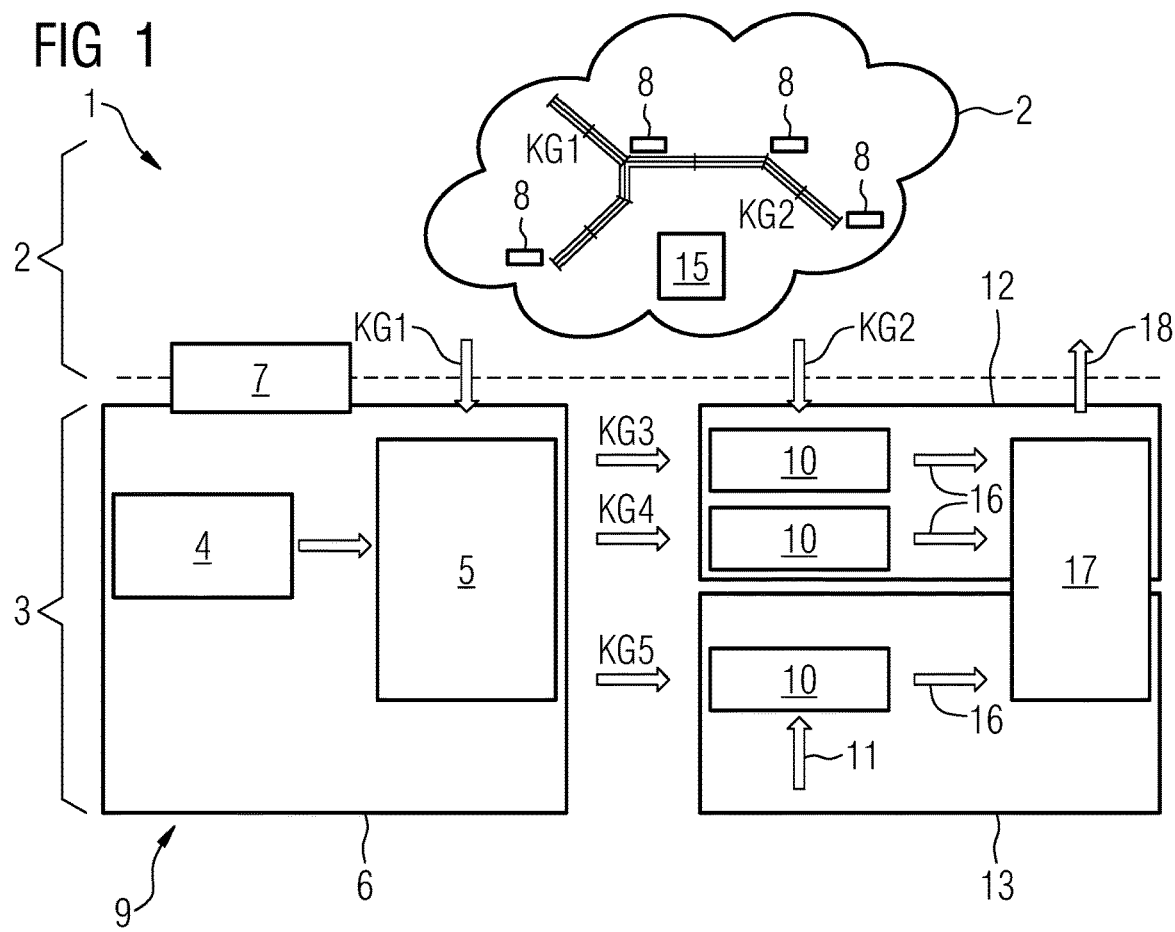
FIG. 1 shows a schematic representation of an exemplary embodiment of an inventive device for monitoring a power supply device of a traffic system.

The traffic system shown by way of example in FIG. 1 is a railway system 1, which by way of example here has a real existing part 2 and a digitally existing part 3.

The real part 2 contains, for instance, the rail network, the rail vehicles, the power supply device 15, the signaling technology, the stations etc. The power supply device 15 makes available the energy required for the railway system 1 and is a traction power supply, for instance.

In the embodiment in FIG. 1, the digital part 3 comprises a number of function devices 10, a computing device 17, and a simulation device 6, which has a parameter device 4 and a model device 5.

A communication device 7 connects the real part 2 with the digital part 3. A number of detection devices 8 which convey the characteristic quantities KG1 and characteristic values KG2 of the railway system 1 via the communication device 7 to the digital part 3 are also available in the real part 2 of the railway system 1.

The traffic system 1 has an inventive monitoring device 9, which comprises the detection devices 8, the communication device 7, and the simulation device 6 with the model device 5 and the parameter device 4.

The detection devices 8 can be a variety of types of sensors or devices, which detect and/or supply the characteristic quantities KG1 and/or characteristic values KG2 of the real part 2 of the railway system 1. The characteristic quantities KG1 can be a current timetable, current data of the rail vehicles, GPS positions and suchlike, for instance. The characteristic values KG2 are for instance electric characteristic values such as current, voltage and variables which can be derived therefrom such as impedances, resistances, output or energy. During operation the characteristic quantities KG1 and characteristic values KG2 are transmitted by way of the communication device 7 to the digital part 3.

The parameter device 4 has predetermined parameters which are relevant to the power supply device 15, such as, for instance, a topography or limits of the network components, target timetables or an expected behavior of loads and network components. The parameters are stored in the parameter device, for instance.

The model device 5 is embodied to create a model of the power supply device 15 and is connected to the parameter device 4. The model device 5 uses parameters and possibly also characteristic quantities KG1 available in the parameter device 4 to create the model. The model of the power supply device produced by the model device 5 is used by the simulation device 6 to simulate the power supply device 15. The model device 5 and the parameter device 4 need not be embodied as separate units.

The simulation device 6 receives the determined characteristic quantities KG1 as actual values of the railway system 1 in real time or virtually in real time via the communication device 7. In contrast to the characteristic values KG2, here the characteristic quantities KG1 are those which are used to simulate the power supply device 15, such as, for instance, a current timetable, current data of the rail vehicles or GPS positions or also current switching states. The simulation device 6 simulates the power supply device 15 with the simulation model created by the model device 5 and the characteristic quantities KG1.

The monitoring device 9 comprises a number of function devices 10, which compare characteristic values KG3, KG4, KG5 calculated in the simulation device 6 with predetermined limit values 11 and/or the current characteristic values KG2. The current characteristic values KG2 are, for instance, electric characteristic values such as current, voltage and variables which can be derived therefrom such as impedances, resistances, output or energy. The current characteristic values KG2 are the current comparison values relating to the simulated characteristic values KG3, KG4, in order to be able to draw a comparison between the characteristic values KG3, KG4 calculated in the simulation and the real existing characteristic values KG2. The calculated characteristic values KG3, KG4, KG5 can also be a time curve of values in the form of a curve, for instance. A distinction can be made here between a current area 12 and a preview area 13.

In the current area 12, the characteristic values KG3, KG4 calculated in the simulation device 6 are compared with the current characteristic values KG2.

In the preview area 13, precalculated future characteristic values KG5 are compared with the limit values 11 and as a result a prognosis is given for the future operation of the power supply device 15.

The function devices 10 forward their comparison results 16 to a computing device 17, which transmits a warning message 18 in the real part 2 when the limit values 11 are exceeded, for instance to a control center of the railway system 1. Alternatively or in addition to the warning messages 18, automatic measures can also be introduced. The performance of the trains can therefore be influenced by way of an automatic train control system, for instance.

Figure 2:
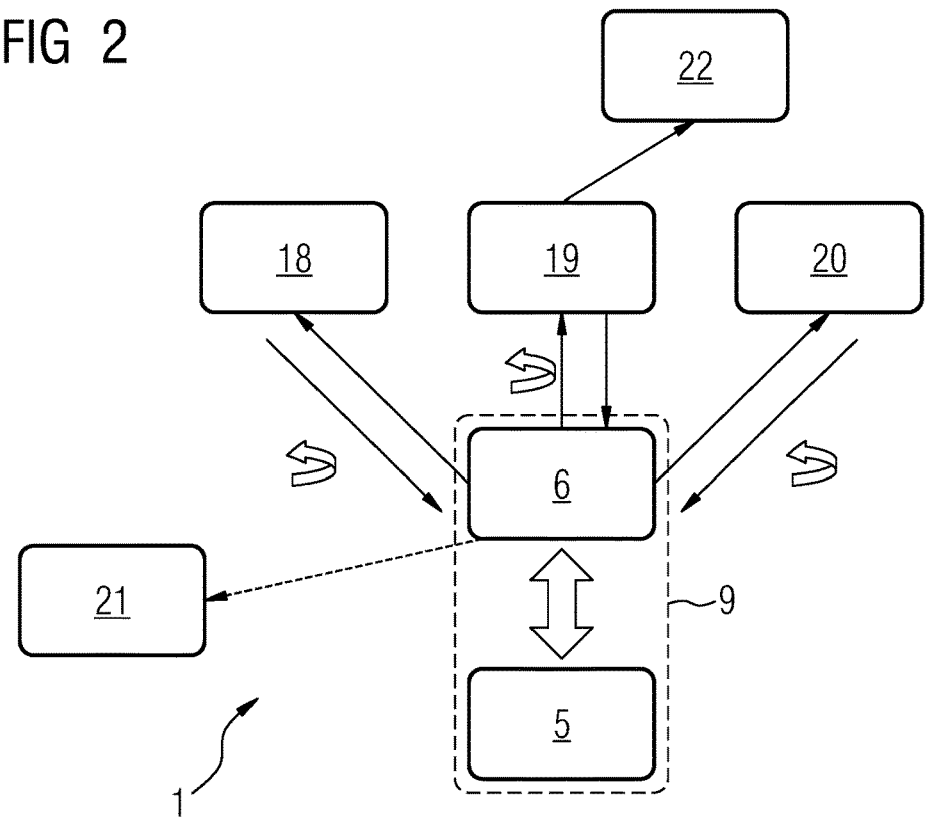
FIG. 2 shows a schematic representation of an exemplary embodiment of an inventive traffic system.

The function devices 10 and/or the computing device 17 can also be embodied by the simulation device 6 or external systems, as are shown for instance in FIG. 2.

FIG. 2 shows a schematic representation of a railway system 1 and a possible replacement of the inventive monitoring device 9 with other devices in the railway system 1. Here the inventive monitoring device 9 is in contact with a timetable management system 23, a load management system 19, a SCADA system 20 and possibly an analysis device 21. A real-time capable controller 22 is connected to the load management 19, for instance. The inventive monitoring device 9 communicates in both directions with the timetable management system 18, the load management system 19 and the SCADA system 20. The communication can take place with a cycle time of seconds, approx. 3 s for instance, or also more rapidly. The SCADA system 20 can have a decision support function, for instance, which allows an operator to check for test scenarios ('what if'). In this regard the operator can enter a possible change in the railway system 1 into the SCADA system 20, which, with the aid of the inventive monitoring device 9, provides the operator with feedback with respect to the test.

FIG. 3 is a flowchart illustrating the basic steps of the method 100 for monitoring a power supply device of a traffic system. Step 110 includes creating a computer-based model of the power supply device with predetermined parameters that are relevant to the power supply device. Step 120 includes, during an ongoing operation of the traffic system, determining at least one current characteristic quantity and simulating an operation of the power supply device with the computer-based model of the power supply device and the determined at least one current characteristic quantity. Step 130 includes precalculating at least one future characteristic value in one desired future time frame with the simulation. Step 140 includes comparing the at least one precalculated future characteristic value with at least one predetermined limit value. Step 150 includes comparing the at least one precalculated future characteristic value with a characteristic value determined during ongoing operation of the traffic system. Step 160 includes automatically outputting a response based on the comparisons of the at least one precalculated future characteristic value. The response can be a warning message and that response may be automatically output when the at least one predetermined limit value is reached or exceeded. Step 165 may be provided which includes automatically introducing at least one measure when the at least one predetermined limit value is reached or exceeded. Step 170 may include calculating parameters for a future operation of the traffic system with the simulation.

The invention claimed is:

1. A method for monitoring a power supply device of a traffic system, the method comprising:
    creating a computer-based model of the power supply device with predetermined parameters that are relevant to the power supply device;
    during an ongoing operation of the traffic system while the power supply device operates to supply power to the traffic system, determining at least one current characteristic quantity and simulating an operation of the power supply device with the computer-based model of the power supply device and the determined at least one current characteristic quantity;
    during the ongoing operation of the traffic system while the power supply device operates to supply power to the traffic system, precalculating at least one future characteristic value in one desired future time frame with the simulation;
    during the ongoing operation of the traffic system while the power supply device operates to supply power to the traffic system, comparing the at least one precalculated future characteristic value with at least one predetermined limit value;
    during the ongoing operation of the traffic system while the power supply device operates to supply power to the traffic system, comparing the at least one precalculated future characteristic value with a characteristic value determined during ongoing operation of the traffic system; and
    during the ongoing operation of the traffic system while the power supply device operates to supply power to the traffic system, outputting a response based on the comparisons of the at least one precalculated future characteristic value.

2. The method according to claim 1, which comprises when the at least one predetermined limit value is reached and/or or exceeded, automatically outputting at least one warning message.

3. The method according to claim 1, which comprises when the at least one predetermined limit value is reached and/or or exceeded, automatically introducing at least one measure.

4. The method according to claim 1, which comprises calculating parameters for a future operation of the traffic system with the simulation.

5. The method according to claim 1, which comprises: during the ongoing operation of the traffic system while the power supply device operates to supply power to the traffic system, taking countermeasures upon determining that the future characteristic value will imminently exceed a limit value.

6. The method according to claim 1, which comprises: during the ongoing operation of the traffic system while the power supply device operates to supply power to the traffic system, influencing an operation of a train of the traffic system based on the comparisons of the at least one precalculated future characteristic value.

7. A device for monitoring a power supply device of a traffic system, the device comprising:
    at least one modelling device configured to generate a computer-based model of the power supply device from predetermined parameters that are relevant to the power supply device;
    at least one detection device configured to determine at least one current characteristic quantity of the traffic system during an ongoing operation of the traffic system while the power supply device operates to supply power to the traffic system; and
    at least one simulation device configured to, during the ongoing operation of the traffic system while the power supply device operates to supply power to the traffic system:
        simulate the power supply device with the computer-based model and the at least one current characteristic quantity,
        precalculate at least one future characteristic value in at least in one desired future time frame with the simulation,
        compare the at least one precalculated future characteristic value with at least one predetermined limit value and a characteristic value determined during ongoing operation of the traffic system, and output a response based on the comparisons of the at least one precalculated future characteristic value.

8. A traffic system, comprising a device according to claim 7.

* * * * *